United States Patent
Kao et al.

(10) Patent No.: US 7,128,132 B2
(45) Date of Patent: Oct. 31, 2006

(54) STAGGERED FIN ARRAY

(75) Inventors: Ping-Sheng Kao, Hsinchu (TW); Tsan-Nan Chien, Taipei (TW); Yu Liu, Tao Yuan (TW); Yu-Nien Huang, Chung Li (TW)

(73) Assignee: Quanta Computer, Inc., Tao Yuan Shien (TW)

( * ) Notice: Subject to any disclaimer, the term of this patent is extended or adjusted under 35 U.S.C. 154(b) by 0 days.

(21) Appl. No.: 11/147,309

(22) Filed: Jun. 8, 2005

(65) Prior Publication Data

US 2006/0092613 A1    May 4, 2006

(30) Foreign Application Priority Data

Nov. 3, 2004    (TW) ............................... 93133513 A

(51) Int. Cl.
*F28F 3/04*    (2006.01)

(52) U.S. Cl. .................................... 165/80.3; 165/185
(58) Field of Classification Search ...... 165/80.1–80.3, 165/185
See application file for complete search history.

(56) References Cited

U.S. PATENT DOCUMENTS

2004/0031587 A1*    2/2004    Fong ......................... 165/80.3

* cited by examiner

*Primary Examiner*—Teresa J. Walberg
(74) *Attorney, Agent, or Firm*—Rabin & Berdo, PC

(57) ABSTRACT

A staggered fin array has a plurality of dissipation fins disposed upright on a substrate. Each dissipation fin has at least one staggered structure at one side or on opposite sides thereof. The staggered structure has two stair structures. Each stair structure has many step surfaces parallel to the airflow direction. An interval surface is formed between adjacent step surfaces. The interval surface is designed as an opening. No more than two leading ledges, formed by the openings, are formed in a single airflow route.

6 Claims, 4 Drawing Sheets

STAGGERED FIN ARRAY

RELATED APPLICATIONS

The present application is based on, and claims priority from, Taiwan Application Ser. No. 93133513, filed Nov. 3, 2004, the disclosure of which is hereby incorporated by reference herein in its entirety.

BACKGROUND

1. Field of Invention

The present invention relates to a fin array for heat dissipation. More particularly, the present invention relates to a fin array applied in a notebook computer.

2. Description of Related Art

As notebook PCs become thinner, there is less and less space for heat convection and heat dissipation design inside the case housing of the notebook PC. When it comes to high-frequency components, such as the CPU (central processing unit) and graphics processing chip, the heat dissipation design hits a bottleneck. Thus, the mainstream framework of heat dissipation design is to enhance average convection co-efficiency between heat dissipation and a centrifugal fan by increasing airflow output of the centrifugal fan.

FIG. 1A illustrates a perspective view of a conventional heat dissipation fin array. When cooling air 102 passes by a conventional extruded aluminum fin set 100 as illustrated in FIG. 1A, a Poiseuille airflow 104 is created. Such a Poiseuille airflow 104 can generate a noise spectrum distribution 106 as illustrated in FIG. 1B. A higher summit point 106a of generated noise spectrum distribution 106 means a more uncomfortable noise is created.

When heat dissipation efficiency is enhanced, airflow is essentially accelerated. The stronger the airflow is, the more turbulent and noisy the wake flow is. Thus, a notebook PC manufacturer faces a challenge between noise and heat dissipation efficiency.

SUMMARY

It is therefore an objective of the present invention to provide a staggered fin array.

In accordance with the foregoing and other objectives of the present invention, a staggered fin array includes a plurality of dissipation fins disposed upright on a substrate. Each dissipation fin has at least one staggered structure at one side or at opposite sides. The staggered structure includes two stair structures. Each stair structure has many step surfaces parallel with airflow direction. An interval surface is formed between adjacent step surfaces. The interval surface is designed as an opening. Leading ledges, formed by the openings, should be kept no more than two at single airflow route.

Thus, the staggered fin array has advantages as follows: (1) lowered noise and high-quality sound; (2) a cross-sectional area of a flow channel that can be maintained the same as conventional ones so that head loss is not increased; and (3) a staggered structure design that increases not only dissipation area but also leading ledges.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
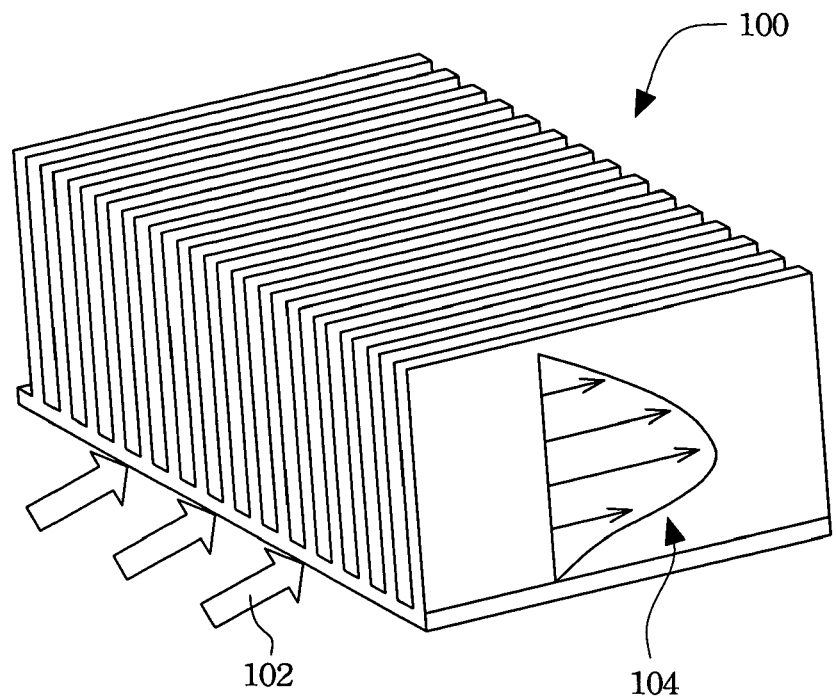
FIG. 1A illustrates a perspective view of a conventional heat dissipation fin array.

Reference will now be made in detail to the present preferred embodiments of the invention, examples of which are illustrated in the accompanying drawings. Wherever possible, the same reference numbers are used in the drawings and the description to refer to the same or like parts.

In order to resolve the issue between noise and heat dissipation efficiency, the present invention provide a staggered fin array. The staggered fin array includes a plurality of dissipation fins, having several staggered structures so that heat dissipation areas and leading ledges can be increased and noise can be reduced as well.

Figure 2:
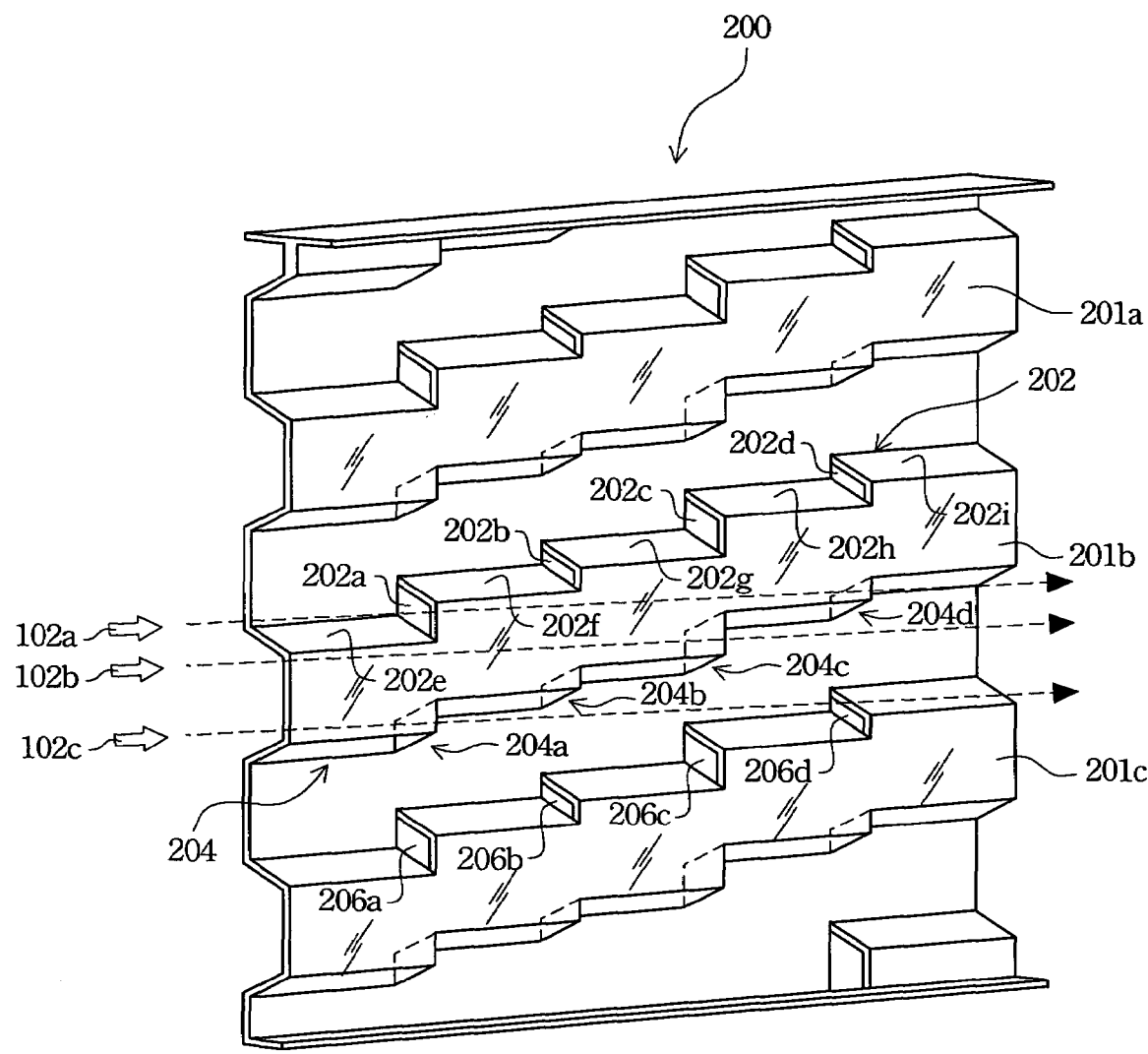
FIG. 2 illustrates a perspective view to explain the relationship between airflow and a staggered fin according to one preferred embodiment of this invention.

FIG. 2 illustrates a perspective view to explain the relationship between airflows and a staggered fin according to one preferred embodiment of this invention. In this preferred embodiment, staggered structures 201a, 201b and 201c are formed on a heat dissipation fin 200 so as to increase heat dissipation areas and leading ledges. Each staggered structure includes two stair structures. For example, the staggered structure 201a includes stair structures 202 and 204. Each stair structure has many step surfaces, and interval surfaces formed between adjacent step surfaces. The interval surface is preferred an opening. For example, an interval surface 202a between adjacent step surfaces 202e and 202f is an opening by which airflow passes. Accordingly, an interval surface 202b between adjacent step surfaces 202f and 202g is also an opening; an interval surface 202c between adjacent step surfaces 202g and 202h is an opening; an interval surface 202d between adjacent step surfaces 202h and 202i is an opening. Each above-mentioned step surface (202e, 202f, 202g, 202h or 202i) and each interval surface (202a, 202b, 202c or 202d) are perpendicular to each other. Although staggered structures are arranged at one side of the heat dissipation fin in this preferred embodiment, they are not limited at one side of the heat dissipation fin and can be arranged at two opposite sides.

As stated above, each staggered structure includes two stair structures. Step surfaces of the stair structure serve as dissipation areas, thus the stair structure can increase the dissipation area of the dissipation fin. That is, step surfaces (202e, 202f, 202g, 202h and 202i) can increase the dissipation area of the dissipation fin 200. Moreover, step surfaces should be parallel with airflow direction to reduce head loss. Although a staggered structure includes two stair structures in this preferred embodiment, it can include only one stair structure as well.

As stated above, the interval surface between adjacent step surfaces is an opening. This kind of opening forms a leading ledge. For example, all openings 202a, 202b, 202c and 202d of the stair structure 202 are leading ledges. Although more leading ledges on single flow route are for the benefit of heat dissipation efficiency, the number thereof is limited and should be no more than a predetermined number, which is preferably 2 leading ledges on single flow route. For example, a single route of an airflow 102a includes openings (leading ledges) 202a and 204a; a single route of an airflow 102c includes openings (leading ledges) 204a and 206d; a single route of an airflow 102b includes only the opening (leading ledge) 204c. Nevertheless, a preferable number of openings (leading ledges) may vary according to varied dissipation materials and airflow strength.

Figure 3:
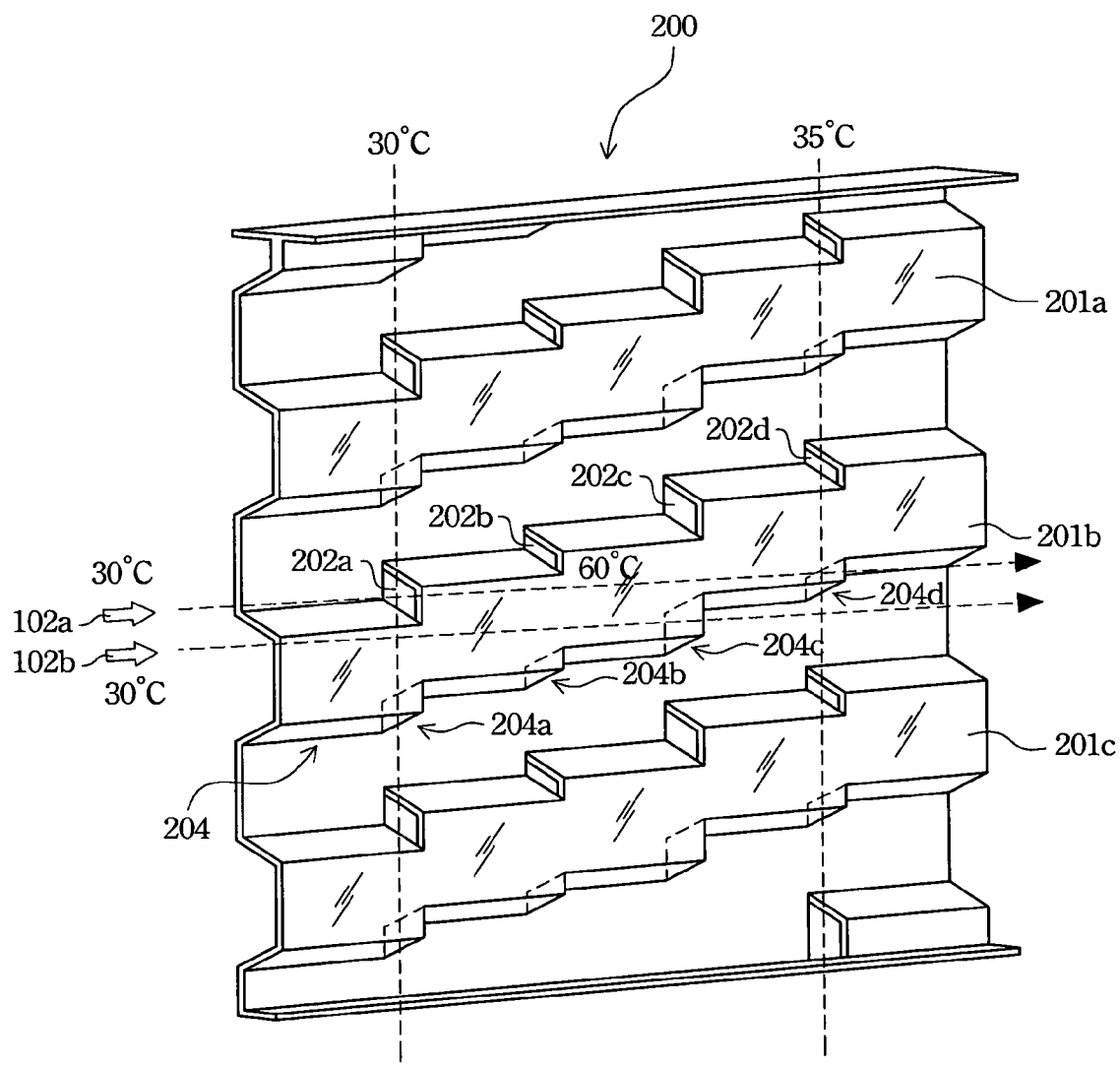
FIG. 3 illustrates a perspective view to explain relationships between airflow, temperatures and a staggered fin according to another preferred embodiment of this invention.

FIG. 3 illustrates a perspective view according to FIG. 2 to explain relationships between airflow, temperatures and a staggered fin according to another preferred embodiment of this invention. An explanation of relationships between airflows, temperatures and a staggered fin will clarify why the staggered fin is more effective in heat dissipation. As stated above, increased openings (leading ledges) can increase heat dissipation efficiency and there are preferred no more than 2 (less than 3) leading ledges on single flow route. The purpose of limited leading ledges is to lower a temperature of airflow, which passes by a leading ledge, as low as possible. For example, the dissipation fin 200 temperature is 60° C., and airflow 102a temperature is 30° C. When the airflow 102a passes by the opening (leading ledge) 202a, the airflow temperature is 30° C. When airflow 102a passes by the opening (leading ledge) 204d, the airflow temperature is 35° C. (because the airflow is heated by the opening 202a). Another airflow 102b passes by only one opening (leading ledge) 204c, the airflow temperature at the opening 204c is 30° C. A large temperature difference between an opening and airflow passing through the opening causes more effective heat dissipation. Therefore, a staggered dissipation fin not only increases dissipation area, but also maintains a large temperature difference between an opening and an airflow passing by the opening so that heat dissipation efficiency can be enhanced.

Figure 1B:
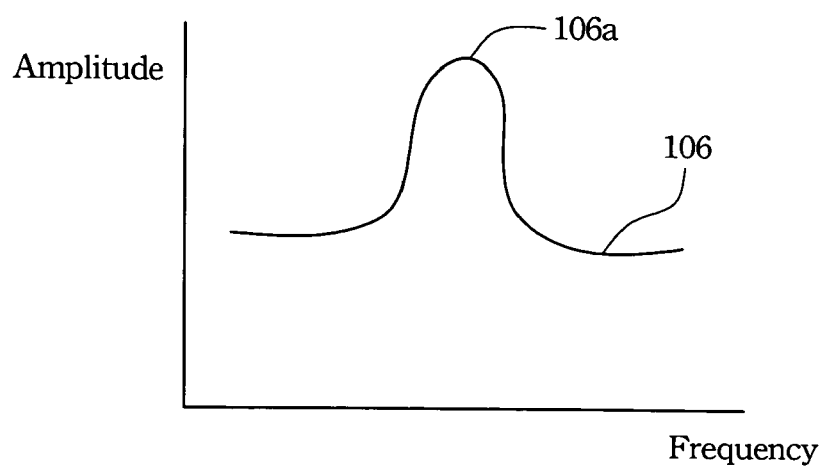
FIG. 1B illustrates a noise spectrum distribution of the conventional heat dissipation fin array of FIG. 1A.
Figure 4A:
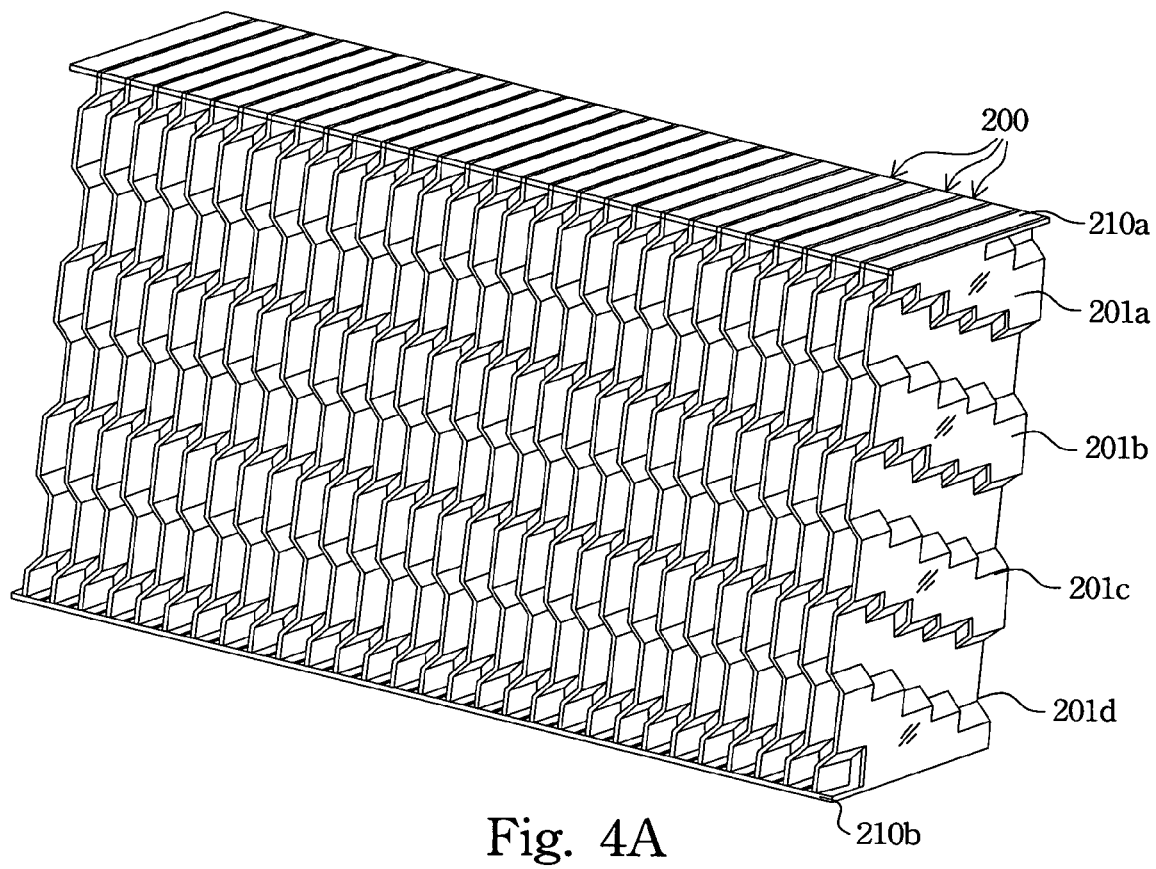
FIG. 4A illustrates a perspective view of a staggered fin array according to another preferred embodiment of this invention.

FIG. 4A illustrates a perspective view of a staggered fin array according to FIG. 2 of this invention. The staggered fin array is composed of many staggered fins 200, secured between an upper substrate 210a and a lower substrate 210b. The staggered fin array may be coupled to a heat pipe to achieve the heat dissipation of some electronic device. In comparison with a structure of the conventional dissipation fin array illustrated in FIG. 1, the staggered fin array has the same cross-sectional area of a flow channel. Thus, lead loss in the flow channel may not be increased. Besides, staggered structures change flow channels by means of leading ledges so that average convention co-efficiency is increased to enhance dissipation efficiency. Flow channels in the staggered fin array may vary according to demand. If flow channels are shortened, leading ledges should be decreased to avoid high lead loss. If flow channels are extended, leading ledges should be increased to enhance dissipation efficiency.

Figure 4B:
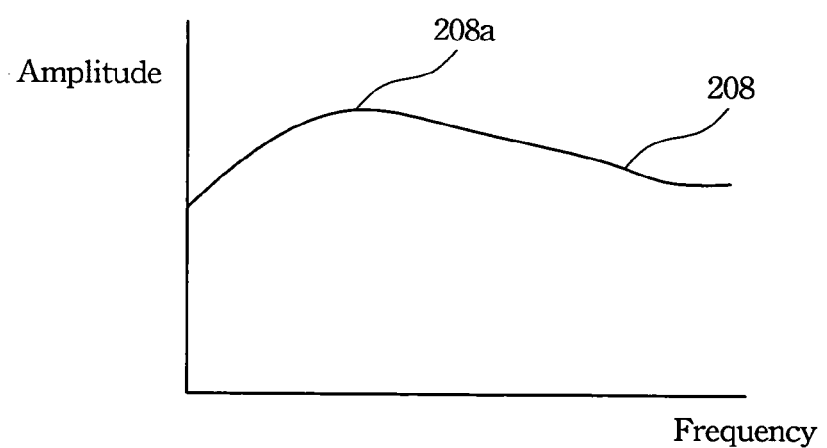
FIG. 4B illustrates a noise spectrum distribution of the staggered fin array of FIG. 4A.

FIG. 4B illustrates a noise spectrum distribution of a staggered fin array of FIG. 4A. Laminar flow or turbulent flow speed distribution can be affected by the staggered fin array so that a haystack noise distribution can be obtained to improve sound quality. In comparison with the noise spectrum distribution 106 illustrated in FIG. 1B, the noise spectrum distribution 208, created by the staggered fin array, has a smooth distribution and a lower summit point 208a. Such a noise spectrum distribution 208 can reduce noise.

According to the preferred embodiments, the staggered fin array has advantages as follows: (1) lowered noise and good quality sound; (2) a cross-sectional area of a flow channel can be maintained the same as that of conventional ones so that head loss will not increased; and (3) staggered structure designs increase not only dissipation area but also leading ledges.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A staggered fin array, comprising:

a substrate;

a plurality of dissipation fins, mounted upright on said substrate, wherein a gap exists between each of said dissipation fins to serve as an airflow channel for cooling air; and at least one staggered structure formed on each of said dissipation fins, each of said staggered structure having two stair structures, said stair structures having a plurality step surfaces parallel to a flow direction of said airflow channel, and a interval surface being formed between adjacent said step surfaces for said airflow channel passing by.

2. The staggered fin array of claim 1, wherein said interval surface is an opening for said cooling air passing therethrough.

3. The staggered fin array of claim 2, wherein a number of said openings is less than three for a single airflow route.

4. A staggered fin array, comprising:

a substrate;

a plurality of dissipation fins, mounted upright on said substrate, wherein a gap exists between each of said dissipation fins to serve as an airflow channel for cooling air; and at least one staggered structure formed on each of said dissipation fins, each of said staggered structure having a stair structure, said stair structure having a plurality step surfaces parallel with a flow direction of said airflow channel, an interval surface being formed between adjacent said step surfaces for said airflow channel passing by.

5. The staggered fin array of claim 4, wherein said interval surface is an opening for said cooling air passing therethrough.

6. The staggered fin array of claim 5, wherein a number of said opening is less than three for a single airflow route.

* * * * *